US008502188B2

(12) United States Patent
Pickett et al.

(10) Patent No.: US 8,502,188 B2
(45) Date of Patent: Aug. 6, 2013

(54) ELECTRICALLY ACTUATED DEVICE

(75) Inventors: Matthew D. Pickett, San Francisco, CA (US); Hans S. Cho, Palo Alto, CA (US); Julien Borghetti, Mountain View, CA (US); Duncan Stewart, Menlo Park, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 136 days.

(21) Appl. No.: 13/142,504

(22) Filed: Jun. 28, 2011

(65) Prior Publication Data
US 2011/0303890 A1 Dec. 15, 2011

Related U.S. Application Data

(63) Continuation of application No. PCT/US2009/032496, filed on Jan. 29, 2009.

(51) Int. Cl.
*H01L 29/02* (2006.01)

(52) U.S. Cl.
USPC ..... 257/5; 257/2; 257/3; 257/4; 257/E29.002; 438/102; 438/103; 438/104

(58) Field of Classification Search
USPC ............... 257/1–5, E29.002; 438/102–104
See application file for complete search history.

(56) References Cited

U.S. PATENT DOCUMENTS

| 6,458,621 | B1 | 10/2002 | Beck |
| 6,855,647 | B2 | 2/2005 | Beck et al. |
| 2008/0079029 | A1* | 4/2008 | Williams ............... 257/213 |
| 2008/0090337 | A1 | 4/2008 | Williams |
| 2011/0233511 | A1* | 9/2011 | Kawashima et al. ............ 257/4 |

OTHER PUBLICATIONS

Blanc, J. et al., "Electrocoloration in SrTiO3: Vacancy Drift & Oxidation-Reduction of Transition Metals," Phy Rev B, 4, No. 10, 1971, pp. 3548-3557.
Choi, B.J. et al., "Resistive switching mechanism of TiO2 thin films grown by atomic-layer deposition," J of Applied Phys, 98, 2005, pp. 033715-033715-10
Dearnaley, G. at al., "Electrical phenomena in amorphous oxide films," Rep Prog Phys, 33, 1970, pp. 1129-1191.
Jeong, D. S. at al., "Impedance spectroscopy of TiO2 thin films showing resistive switching," App Phys Ltr, 89, 2006, pp. 082909-082909-3.
Knauth, P., "Defect and transport properties of nanocrystalline ceramics and thin films," J Solid State Electrochern, 6, 2002. pp. 165-171.
Meijer, G.I., "Who wins the nonvolatile memory race?," Science, 313, 2008, pp. 1625-1626.
Sawa, A., "Resistive switching in transition metal oxides," Materialstoday, Nov. 6, 2008, pp. 28-36.
Strukov, D.B. at el., "The missing memristor found," Nature, 453, 2008, pp. 80-83.

(Continued)

*Primary Examiner* — Jami M Valentine

(57) ABSTRACT

An electrically actuated device includes a first electrode and a second electrode crossing the first electrode at a non-zero angle, thereby forming a junction therebetween. A material is established on the first electrode and at the junction. At least a portion of the material is a matrix region. A current conduction channel extends substantially vertically between the first and second electrodes, and is defined in at least a portion of the material positioned at the junction. The current conduction channel has a controlled profile of dopants therein.

13 Claims, 1 Drawing Sheet

OTHER PUBLICATIONS

Strukov, D.B. et al., "Exponential ionic drift: fast switching and low volatility of thin-film memristors." Appl Phys A, 2008, (5 pages).
Waser, R. et al., "Naneionics-based resistive switching memories," Nature Materials, Jun. 2007, pp. 833-840.
Weibel, A. et al:, "Electrical properties and defect chemistry of anatase (TiO2)," Solid State Ionics, 177, 2006, pp. 229-236.
Yang, J.J. et al., "Memristive switching mechanism for metal/oxide/metal nanodevices," Nature Nanotechnology, Mar. 2008, pp. 429-433.
Rothschild, A. et al. "Electronic and transport properties of reduced and oxidized nanocrystalline TiO2 films," App Phys Ltr, 82, Apr. 2003, pp. 574-576.

* cited by examiner

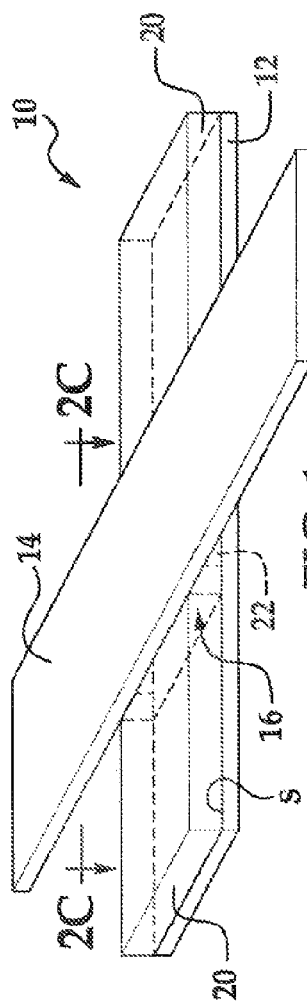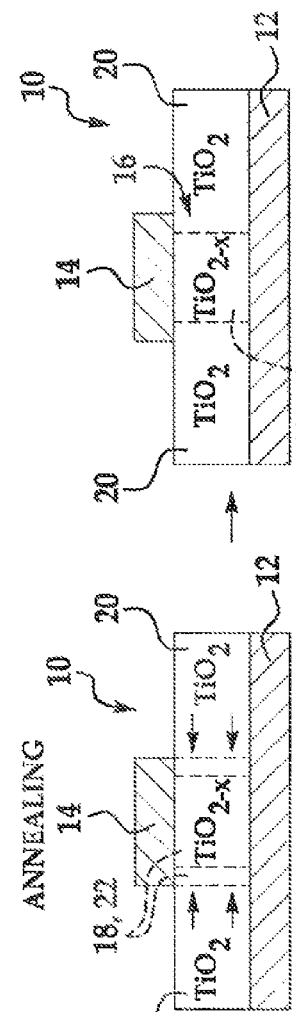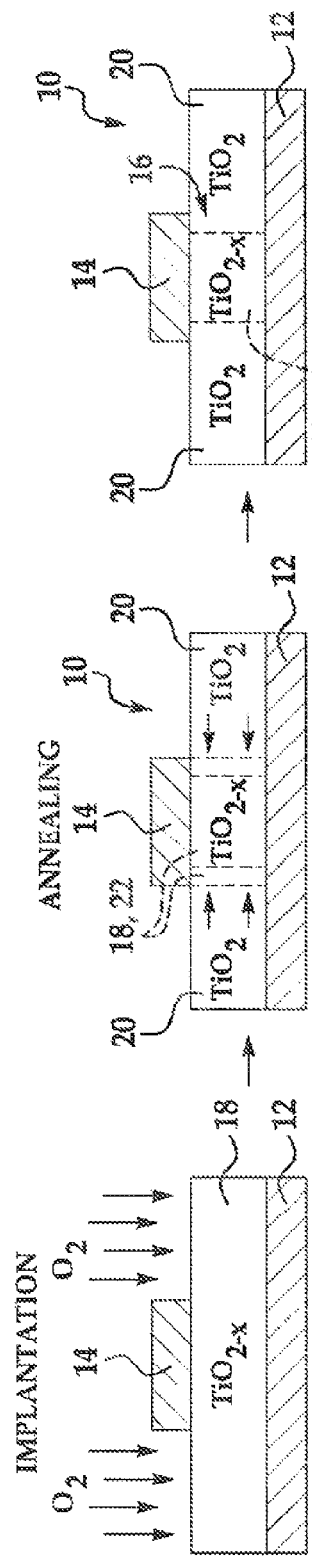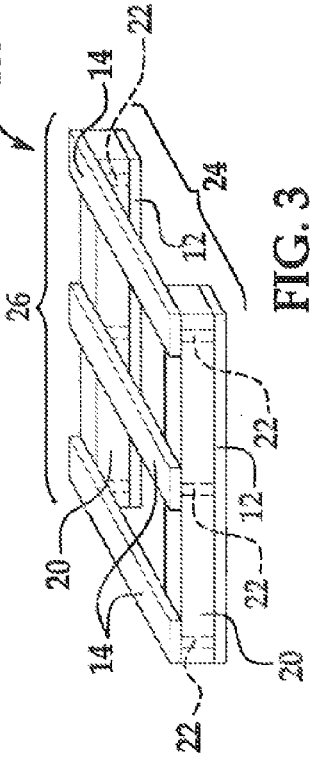

ELECTRICALLY ACTUATED DEVICE

CROSS-REFERENCE TO RELATED APPLICATIONS

This application is a continuation application of International Application Number PCT/US09/32496 filed Jan. 29, 2009, incorporated herein by reference in its entirety.

BACKGROUND

The present disclosure relates generally to electrically actuated devices.

Nanometer-scale crossed-wire switching devices have previously been reported that could be switched reversibly and had an ON-to-OFF conductance ratio up to $10^4$. Such devices have been used to construct crossbar circuits and provide a promising route for the creation of ultra-high density non-volatile memory and systems with dynamic/synaptic logic. A latch (which is an important component for logic circuits and for communication between logic and memory) has been fabricated from a series connection of crossed-wire switches. New logic families, constructed entirely from crossbar arrays of switches or as hybrid structures composed of switches and transistors, have also been described. These new logic families have the potential to dramatically increase the computing efficiency of CMOS circuits.

BRIEF DESCRIPTION OF THE DRAWINGS

Features and advantages of embodiments of the present disclosure will become apparent by reference to the following detailed description and drawings, in which like reference numerals correspond to the same or similar, though perhaps not identical, components. For the sake of brevity, reference numerals having a previously described function may or may not be described in connection with subsequent drawings in which they appear.

FIG. 1 is a semi-schematic perspective view of an embodiment of a single cross-point electrically actuated device;

FIGS. 2A through 2C are semi-schematic cross-sectional views of an embodiment of a method for forming the single cross-point electrically actuated device of FIG. 1, where FIG. 2C is the cross-sectional view of the device of FIG. 1 taken along the 2C-2C line; and FIG. 3 is a semi-schematic perspective view of an embodiment of a crossbar array.

DETAILED DESCRIPTION

Memristor device operation relies on the motion of mobile charged species through a channel within semiconductors and insulators. In a vertically oriented structure, the device center is distinguishable from (and is located between) its sidewalls, which are defined by the edges of the top and bottom electrodes. The nature of memristor channel forming is non-deterministic, and the present inventors have found that by using the embodiments of the method disclosed herein, the active region/conductive channel of the device may be reliably positioned at the junction center. As such, reliable device fabrication and operation may be achieved. Such positioning may be particularly desirable to avoid chemical and topological defects often present at the edges.

Furthermore, such vertically oriented devices may be implemented into a cross-bar array, which includes a plurality of junctions. With device sizes shrinking, the distance in between two side by side junctions becomes comparable to the thin film thickness. It is believed that by reliably positioning the active region or conductive channel at the center of each junction in the array using the method(s) disclosed herein, cross-talk within the array may advantageously be reduced or eliminated. More specifically, the active region located in the junction center reduces or eliminates the unintentional formation of a conducting path between two adjacent electrodes within the same layer of the array when the electrical potential (applied to each electrode in the course of electrical forming of their respective junctions) leads to a gradient between the two electrodes that exceeds a certain level. Still further, it is believed that the active region in the junction center may also reduce or eliminate potentially undesirable effects resulting from the formation of a gradient alone.

The embodiments of the method and electrically actuated device (memristor) advantageously include the active region/conductive channel controllably positioned at the junction center. In addition to the other advantageous features listed hereinabove, the formation of the device center-located conductive channel is reproducible at each electrode junction in a crossbar array. Furthermore, the dopant profile of the conductive channel is substantially controllable via the methods disclosed herein for forming such devices and arrays.

Referring now to FIG. 1, an embodiment of the electrically actuated device 10 including two electrodes 12, 14 having a single cross-point/junction 16 therebetween is depicted. FIGS. 2A through 2C will also be discussed in conjunction with the discussion of FIG. 1.

The device 10 shown in the Figures is generally constructed vertically, and thus the electrodes 12, 14 are bottom and top electrodes, respectively.

The electrodes 12, 14 may be formed of any suitable conductive material (e.g., gold, platinum, tungsten, copper, etc.), and may have any suitable thickness (e.g., ranging from about 5 nm to about 30 nm). It is to be understood that both the material and the thickness of the electrodes 12, 14 may be varied as is desirable to achieve one or more particular device properties. Although individual electrodes 12, 14 in the figures are shown with square or rectangular cross-sections, wires may also have circular, elliptical, or more complex cross-sections. The electrodes 12, 14 may also have many different widths or diameters and aspect ratios or eccentricities.

The first electrode 12 may be fabricated using conventional techniques, such as photolithography or electron beam lithography, or by more advanced techniques, such as imprint lithography.

In the vertically constructed device 10, as shown in FIG. 2A, a material 18 (discussed further hereinbelow) is established on a surface S of the first or bottom electrode 12. It is to be understood that a portion of the material 18 ultimately forms a matrix region 20, and another portion of the material 18 forms the conductive channel 22. While the material 18 is shown as being established on the entire surface S, it is to be understood that, in some embodiments, the material 18 may be established on a portion of the first electrode 12. Generally, when the material 18 is established on a portion of the first electrode surface S, one portion of the material 18 is positioned such that it will be located in the junction 16 between the electrodes 12, 14, and another portion of the material 18 is positioned such that it will be located adjacent to the portion in the junction 16. As such, once the second electrode 14 is positioned thereon, some of the material 18 will be covered by the electrode 14, and some of the material 18 will remain uncovered.

Suitable deposition techniques for the material 18 include conventional physical and chemical techniques, including evaporation from a heated source, such as a filament or a Knudsen cell, electron beam (i.e., e-beam) evaporation from a crucible, sputtering from a target, other forms of evaporation, chemical vapor deposition (CVD), molecular beam deposition, atomic layer deposition, or various other forms of chemical vapor or beam growth from reactive precursors. Appropriate deposition or growth conditions, such as speed and temperature, may be selected to achieve the desirable chemical composition and local atomic structure desired for the material 18.

In an embodiment, the material 18 that is initially established on the electrode 12 is a material that is suitable for forming both the matrix region 20 and the current conduction channel 22 (shown in FIGS. 1 and 2C). Non-limiting examples of such materials 18 include $TiO_{2-x}$, $NiO_{2-x}$, $ZrO_{2-x}$, $SrTiO_{3-x}$, $GaN_{1-x}$, $CuCl_{1-x}$, and GaN:S. It is to be understood that the material 18 is selected so that after device 10 fabrication (i.e., implantation shown in FIG. 2A and annealing shown in FIG. 26), i) the matrix region 20 is electrically insulating, and ii) the current conduction channel 22 is an electrically conducting material which has a conductance that can be modulated by the application of a field between the top electrode 14 and bottom electrode 12.

Once the material 18 is established, the top/second electrode 14 is positioned thereon at some desirable angle that is non-parallel to the orientation of the bottom/first electrode 12. The second electrode 14 may be the same material as or a different material than the first electrode 12, and may be established via the same or a different technique than that used to establish the first electrode 12. In one example, the second electrode 14 is evaporated on the material 18 with an electron beam evaporator.

Referring now specifically to FIG. 2A, the exposed portions of the material 18 (i.e., the material not covered by the electrode 14) are exposed to an implantation process once the device components 12, 14 and 18 are established. During this process, a mobile species is implanted into and through the depth of the exposed portions of the material 18. In this embodiment, the second electrode 14 acts as a mask to the implanted mobile species. As such, the portion of the material 18 underlying the electrode 14 remains unexposed to the mobile species after implantation is complete.

The mobile species implanted into the exposed portions of the material 18 is any suitable species that in combination with the material 18 will form the matrix region 20. More specifically, the species implanted into the exposed portions of the material 18 is any suitable species that will, in combination with the material 18, generate a more insulating (more stoichiometric) material, and will confine the active region (i.e., current conduction channel 22, which is more non-stoichiometric) of the device 10 to the center of the junction 16. In one embodiment, the matrix region 20 formed as a result of species implantation is at least 4 orders of magnitude more resistive than the material 18. The insulating property of the matrix region 20 (in combination with the center location of the channel 22) may be particularly desirable for reducing the cross-talk between active regions/conduction channels 22 in adjacent junctions 16 of, for example, a cross-bar array (shown in FIG. 3).

As such, the particular mobile species implanted will depend, at least in part, on the material 18 initially established on the first electrode 12. In one embodiment, the mobile species is a plurality of ions. In this embodiment, ion implantation, in which ions are generated from a gaseous source, is used to implant the mobile species. It is believed that the directionality of the ion implantation (i.e., bombardment) may be altered by tuning the gas pressure as well as the ion energy.

In the non-limiting example shown in FIG. 2A, the material 18 is $TiO_{2-x}$, where $x \leq 2$, and the mobile species includes oxygen ions generated using oxygen gas ($O_2$). The implanted mobile species reacts with the material 18 to form the matrix region 20. In this non-limiting example, the initially deposited material 18 is rich in oxygen vacancies (which serve as dopants during device 10 operation), and the implanted mobile species eliminates (i.e., passivates) such vacancies in the exposed areas, thereby forming the matrix region 20. As previously mentioned, the area of material 18 underneath the electrode 14 remains unexposed to the mobile species, and as such, the self-aligned portion remains rich in oxygen vacancies (dopants). This portion of the device 10 is the active region or current conduction channel 22 (as shown in FIG. 2B).

Other non-limiting examples of the material 18, corresponding mobile species, resulting matrix regions 20, and corresponding dopants are shown in Table 1 below.

TABLE 1

| Material | Mobile species | Matrix Region | Dopant |
| --- | --- | --- | --- |
| $NiO_{2-x}$ | Oxygen ions | $NiO_2$ | Oxygen vacancies or metal interstitials |
| $GaN_{1-x}$ | Nitrogen ions | GaN | Nitrogen vacancies |
| $ZrO_{2-x}$ | Oxygen ions | $ZrO_2$ | Oxygen vacancies or metal interstitials |
| $HfO_{2-x}$ | Oxygen ions | $HfO_2$ | Oxygen vacancies or metal interstitials |
| $SrTiO_{3-x}$ | Oxygen ions | $SrTiO_3$ | Oxygen vacancies or metal interstitials |
| $CuCl_{1-x}$ | Chlorine ions | CuCl | Chlorine vacancies or copper interstitials |

When cations or anions are used as the dopant in the material 18, it will be desirable to implant a cation/anion passivating or cation/anion trapping species that will react with the material 18 to form the insulating matrix region 20 at the exposed region(s) of the material 18, while leaving the cation or anion dopants in the unexposed region of the material 18.

Referring now to FIG. 2B, the device 10 is then exposed to annealing for a predetermined time. Annealing causes the implanted mobile species to activate, and in some instances, to diffuse into the portion of the material 18 that is unexposed to the species after implantation, as illustrated by the arrows in FIG. 2B. When species diffusion is initiated, it is to be understood that the species will continue to diffuse until the annealing is ceased. The diffusion of the mobile species into the material 18 will shrink the width (as schematically illustrated by the phantom lines in FIG. 2B) of the conduction channel 22 to a desirable size. It is to be understood that the dimensions for the channel 22 may not be exactly the same along the length of the channel 22 (i.e., from one electrode 12 to the other electrode 14), at least in part because the implantation profile along the implantation direction may, in some instances, be non-uniform.

In one embodiment, annealing is accomplished for a time suitable to activate the implanted species without driving the species into the channel 22. In another embodiment, annealing is accomplished for a time suitable to activate and diffuse the implanted species into the channel 22, thereby adjusting the width of the channel 22. As such, the conduction channel 22 has a width that is less than or equal to the width of the second electrode 14 (i.e., the electrode that acts as a mask during species implantation).

The temperature and time for annealing may vary depending, at least in part, on the material 18 and the mobile species used, a suitable thermal budget (which may be limited by other devices, for example, in a crossbar), the size of the electrodes 12, 14 used, and other device 10 characteristics and/or processing conditions. Very generally, annealing may be accomplished at a temperature ranging from about 300° C. to about 1000° C., and for a time ranging from a fraction of a second to several hours. In an embodiment (for example, when the matrix region 20 includes $TiO_2$), the temperature range is at least about 300° C., and may be up to about 600° C. In other embodiments, the time for exposure to annealing ranges from about 1 microsecond to about 1 second or from about 30 seconds to about 30 minutes. In still another embodiment (for example, when flash lamp or pulsed laser annealing is utilized), the time for exposure ranges from about 2 nanoseconds to about 2 microseconds, and the temperature may be at the higher end (e.g., closer to 1000° C.) of the previously mentioned temperature range.

Annealing may be accomplished in a tube furnace, or using a flash lamp or pulsed laser. Annealing accomplished in a tube furnace will heat the entire device 10 (or array in which the device 10 is included). In some instances (e.g., when fabricating a cross-bar array including multiple devices 10 layered upon each other), it may be desirable to use flash lamp or pulsed laser annealing. These particular techniques may be accomplished for a very short time (examples of which are given above): and in this time frame, the component of the device 10 (or array) exposed to the flash/pulse may be increased to the desirable temperature without heating other components in the device 10 (or array). For example, the surface of matrix 20 of one device 10 in a layered array of devices 10 may be exposed to the flash or pulse, which increases the temperature of the matrix region 20 without heating the layers beneath the matrix region 20. In this non-limiting example, at the conclusion of the annealing process, the total amount of heat imparted by the flash/pulse is small, and thus the device 10 or array equilibrates at a much lower temperature than if the same temperature was applied to the entire device 10 or array (as occurs during furnace anneals).

It is believed that longer annealing times will generally create thinner channels 22. In some instances, it may be desirable to adjust the channel 22 width such that the channel 22 is as far from the respective side walls of the electrode 14 without pinching off (i.e., destroying) the channel 22. In any embodiment, annealing is stopped prior to the mobile species diffusing through all of the remaining material 18, otherwise the conduction channel 22 is destroyed.

The resulting device 10 (shown in FIGS. 1 and 2C) includes the conduction channel 22 having a desirable width and extending between the two electrodes 12, 14 in a center portion of the junction 16, and the matrix region(s) 20 adjacent the channel 22. Since the conduction channel 22, in this embodiment, is made up of the remaining material 18, it is to be understood that the material 18 selected has the desirable dopants for operating the device 10 therein. As such, the concentration profile of the dopants in the conduction channel 22 may be controlled by controlling the dopant profile in the material 18. Such dopants may be the previously mentioned charged vacancies, cations, or anions.

The device 10 may be switched between the ON and OFF states by applying appropriate voltages across the junction(s) 16 in order to drive the dopants vertically through the conduction channel 22. The voltage applied will depend, at least in part, on the dopants used and their concentration, and on the material 18 used. Non-limiting examples of such voltages range from about 100 mV (millivolts) to about 20 V (volts). It is to be understood that during device 10 operation, the matrix region 20 does not change. Furthermore, the electric field between the electrodes 12, 14 in the device 10 during operation should generally be larger than about 10 kV/cm (kilovolts/centimeter).

Referring now to FIG. 3, a crossbar 100 including a plurality of the devices 10 shown and described in reference to FIG. 1 and FIGS. 2A-2C is depicted. Generally, the crossbar 100 is an array of switches wherein each member in one set 24 of parallel electrodes 12 connects to every member of a second set 26 of parallel electrodes 14 that intersects the first set 24. In many instances, the two sets 24, 26 of electrodes 12, 14 are perpendicular to each other. However, this is not a necessary condition, and the two sets 24, 26 of electrodes 12, 14 may be offset at any non-zero angle.

It is to be understood that each of the junctions 16 (i.e., crosspoints) in the crossbar 100 are individually addressable after initial fabrication.

In any of the embodiments disclosed herein, the device 10 and/or crossbar 100 may be established on a substrate (not shown). The substrate may be any desirable material, including, but not limited to insulating materials or semiconductor materials. Non-limiting examples of specific substrate materials include silicon dioxide, silicon nitride, magnesium oxide, aluminum oxide, sapphire, strontium titanate, glass, or the like. The substrate may also include an insulating layer of one of the listed materials on a conducting or semiconducting substrate.

While several embodiments have been described in detail, it will be apparent to those skilled in the art that the disclosed embodiments may be modified. Therefore, the foregoing description is to be considered exemplary rather than limiting.

What is claimed is:

1. An electrically actuated device, comprising:
a first electrode;
a second electrode crossing the first electrode at a non-zero angle, thereby forming a junction therebetween; and
a material established on the first electrode and at the junction, the material including:
a non-stoichiometric portion positioned in a center portion of the junction and in direct contact with both the first and second electrodes, the non-stoichiometric portion forming a current conduction channel extending substantially vertically between the first and second electrodes, the current conduction channel having a controlled profile of dopants therein; and
a stoichiometric portion confining the non-stoichiometric portion in the center portion, the stoichiometric portion defining an electrically insulating matrix region.

2. The electrically actuated device as defined in claim 1 wherein the dopants are selected from charged vacancies, anions, or cations.

3. The electrically actuated device as defined in claim 1 wherein the electrically insulating matrix region of the material is substantially void of the dopants.

4. The electrically actuated device as defined in claim 1, further comprising:
a first plurality of parallel electrodes including the first electrode;
a second plurality of parallel electrodes including the second electrode, the second plurality of parallel electrodes crossing the first plurality of parallel electrodes at a non-zero angle, thereby forming a plurality of junctions; and the material established on each of the electrodes in the first plurality and at the plurality of junctions, each material including:

the non-stoichiometric portion positioned in a center portion of a respective one of the plurality of junctions and in direct contact with one of the electrodes of the first plurality and one of the electrodes of the second plurality, the non-stoichiometric portion forming a respective current conduction channel i) extending substantially vertically between the one of the electrodes of the first plurality and the one of the electrodes of the second plurality, and ii) having a controlled profile of dopants therein; and the stoichiometric portion confining the non-stoichiometric portion in the center portion, the stoichiometric portion defining an electrically insulating matrix region.

5. The device as defined in claim 1 wherein the current conduction channel has a width that is less than or equal to a width of the second electrode.

6. A method of forming an electrically actuated device, the method comprising:

establishing a non-stoichiometric material on at least a portion of a first electrode;

positioning a second electrode at a non-zero angle with respect to a position of the first electrode and in operative contact with some of the non-stoichiometric material;

implanting a predetermined mobile species into a portion of the non-stoichiometric material that is unmasked by the second electrode, thereby forming a stoichiometric material that defines an electrically insulating matrix region and initially defining a current conduction channel made up of the non-stoichiometric material that contacts both the first electrode and the second electrode, the stoichiometric material confining the non-stoichiometric material; and annealing the electrically insulating matrix region, thereby activating the mobile species and shrinking a width of the current conduction channel.

7. The method as defined in claim 6 wherein annealing is accomplished for a time sufficient to cause the predetermined mobile species to diffuse to the non-stoichiometric material that contacts both the first electrode and the second electrode and that, during implanting, is masked by the second electrode.

8. The method as defined in claim 7, further comprising stopping annealing before the predetermined mobile species diffuses through the entire width of the non-stoichiometric material that contacts both the first electrode and the second electrode.

9. The method as defined in claim 6, further comprising controlling the dopant profile within the current conduction channel by altering a concentration of dopants in the non-stoichiometric material.

10. The method as defined in claim 6 wherein prior to implanting, the non-stoichiometric material contains dopants, and wherein subsequent to implanting, the predetermined mobile species passivates at least some of the dopants in the non-stoichiometric material to form the stoichiometric material that defines the electrically insulating matrix region.

11. The method as defined in claim 6 wherein annealing is accomplished at a temperature ranging from about 300° C. to about 1000° C.

12. The electrically actuated device as defined in claim 1 wherein one of:

the stoichiometric portion is $TiO_2$ and the non-stoichiometric portion is $TiO_{2-x}$;

the stoichiometric portion is $NiO_2$ and the non-stoichiometric portion is $NiO_{2-x}$;

the stoichiometric portion is GaN and the non-stoichiometric portion is $GaN_{1-x}$;

the stoichiometric portion is $ZrO_2$ and the non-stoichiometric portion is $ZrO_{2-x}$;

the stoichiometric portion is $HfO_2$ and the non-stoichiometric portion is $HfO_{2-x}$;

the stoichiometric portion is $SrTiO_3$ and the non-stoichiometric portion is $SrTiO_{3-x}$; or the stoichiometric portion is CuCl and the non-stoichiometric portion is $CuCl_{1-x}$.

13. The method as defined in claim 6 wherein one of:

the non-stoichiometric material is $TiO_{2-x}$, the predetermined mobile species is oxygen ions, and the stoichiometric material is $TiO_2$;

the non-stoichiometric material is $NiO_{2-x}$, the predetermined mobile species is oxygen ions, and the stoichiometric material is $NiO_2$;

the non-stoichiometric material is $GaN_{1-x}$, the predetermined mobile species is nitrogen ions, and the stoichiometric material is GaN;

the non-stoichiometric material is $ZrO_{2-x}$, the predetermined species is oxygen ions, and the stoichiometric material is $ZrO_2$;

the non-stoichiometric material is $HfO_{2-x}$, the predetermined mobile species is oxygen ions, and the stoichiometric material is $HfO_2$;

the non-stoichiometric material is $SrTiO_{3-x}$, the predetermined mobile species is oxygen ions, and the stoichiometric material is $SrTiO_3$; or the non-stoichiometric material is $CuCl_{1-x}$, the predetermined mobile species is chlorine ions, and the stoichiometric material is CuCl.

* * * * *